United States Patent [19]

Bartlett

[11] Patent Number: 4,639,689
[45] Date of Patent: Jan. 27, 1987

[54] INDUCTIVE LOOP DETECTOR

[75] Inventor: David W. Bartlett, Natal, South Africa

[73] Assignee: E M X International Limited, United Kingdom

[21] Appl. No.: 769,868

[22] Filed: Aug. 27, 1985

[30] Foreign Application Priority Data

Sep. 4, 1984 [GB] United Kingdom ............... 8422277

[51] Int. Cl.$^4$ .................. G01N 27/00; G08G 1/01
[52] U.S. Cl. .................................. 331/65; 340/568; 340/941
[58] Field of Search ............ 331/2, 4, 10, 11, 17, 331/23, 25, 36 R, 65; 340/74, 117, 568, 933, 938, 939, 941; 324/327, 207, 222, 236

[56] References Cited

U.S. PATENT DOCUMENTS 4,358,749 11/1982 Clark .............................. 331/25 X
4,459,561 7/1984 Clark et al. ...................... 324/236 X Primary Examiner—Eugene R. LaRoche
Assistant Examiner—D. C. Mis
Attorney, Agent, or Firm—Pasquale A. Razzano

[57] ABSTRACT

An inductive loop has its frequency of oscillation controlled by means of a counter, a reference frequency source, a comparator, and an attenuator. The frequency of the loop is compared by the comparator to the frequency of the reference source to produce an error signal which controls the attenuator. The amplitude of the output signal of the attenuator is used to adjust the loop frequency to a desired value.

16 Claims, 2 Drawing Figures

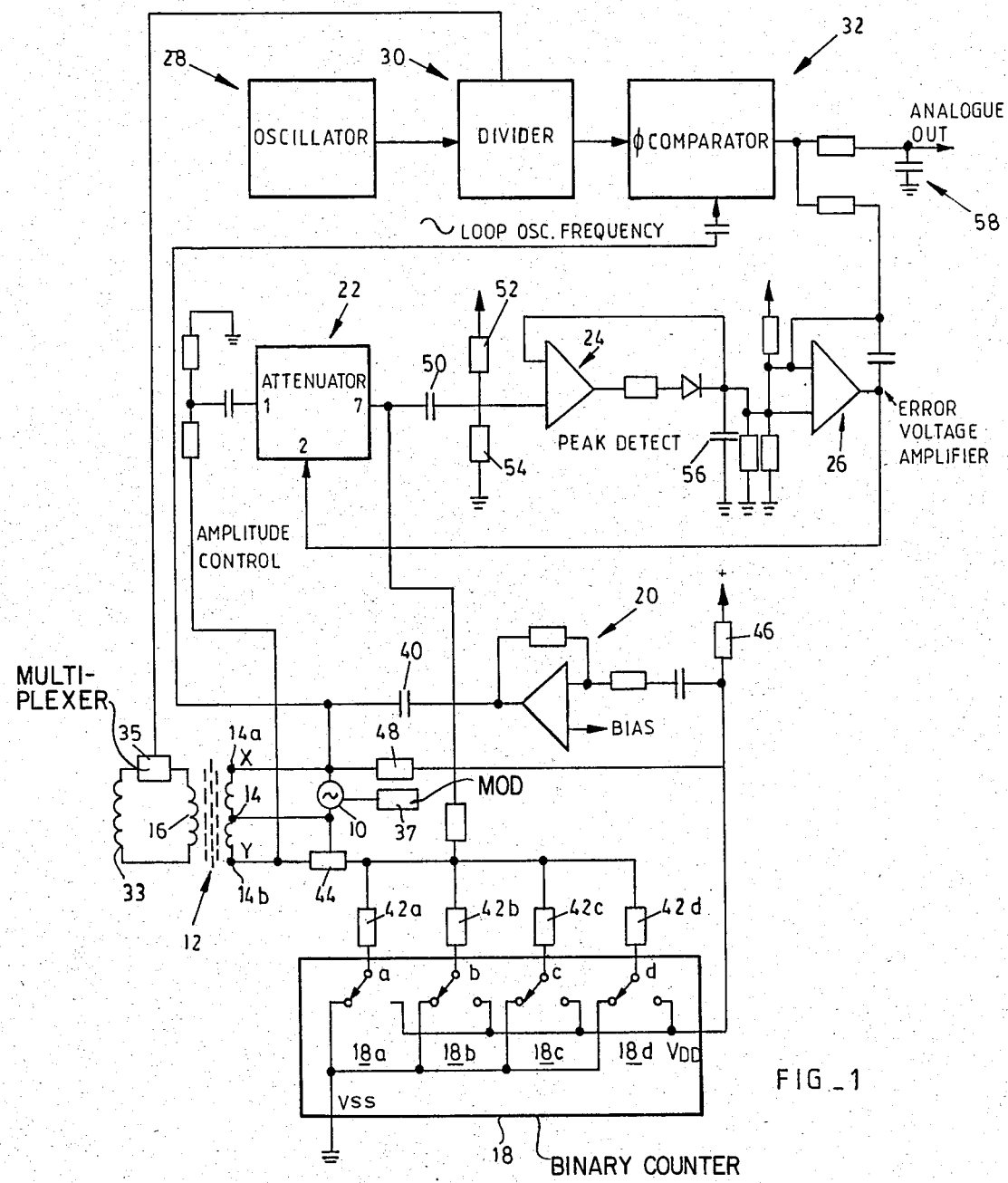
FIG_1

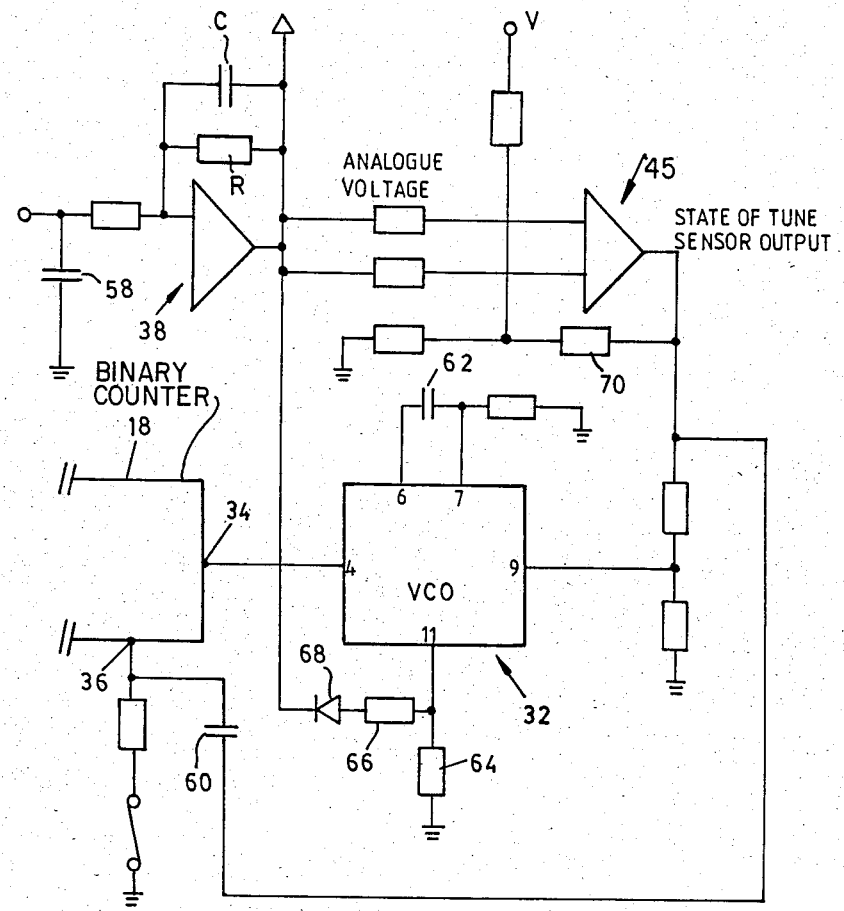
FIG_2

INDUCTIVE LOOP DETECTOR

BACKGROUND OF THE INVENTION

This invention relates generally to inductive loop detectors which are suitable for vehicle detection. The principles of the invention are however applicable to any system in which the frequency of oscillation of an inductive loop is to be controlled.

Certain countries have stringent specifications which are applicable to inductive loop vehicle detectors. For example it may be specified that the loop excitation frequency must fall within an allocated band which extends from 62 to 78 kHz and during operation the loop frequency must not deviate from the specific authorized frequency by more than 0.1%.

Crystal oscillator excited loops have been used to obtain precise frequencies but these require switching of capacitor banks in order to trim the loop resonant frequency equal to that of the crystal oscillator. This is a cumbersome method which is usually manually implemented and is not suited to self-tuning designs. Another approach to the problem is shown in the specification of U.S. Pat. No. 4,459,561.

SUMMARY OF THE INVENTION

It is an object of the present invention to provide an alternative method of controlling the frequency of an inductive loop.

The invention provides a method of controlling the frequency of oscillation of an inductive loop which is excited by a first signal which includes the steps of deriving a second signal which is dependent at least on the first signal, deriving a third signal which is in antiphase to the first signal, combining at least a proportion of the third signal with the second signal to produce a fourth signal, and coupling the fourth signal to the first signal.

The fourth signal may be capacitively coupled to the first signal. The proportion of the third signal which is combined with the second signal may be a variable proportion. The variable proportion may be selected from one of a plurality of fixed proportions. Alternatively or additionally the proportion of the third signal is a continuously variable proportion. As indicated both approaches may be adopted and in this event the selected fixed proportion signal is combined with the continuously varying proportion to achieve precise control of the frequency of the inductive loop.

The method of the invention may include the step of reducing the rate of change of proportion of the third signal, which is combined with the second signal, as the frequency of the loop approaches a desired frequency.

The method may further include the steps of deriving a fifth signal which is dependent on the frequency of oscillation of the loop, deriving a sixth signal which is dependent on the frequency of a reference source, comparing the fifth and sixth signals, generating an error signal which is dependent on the difference in frequency between the fifth and sixth signals, and capacitively coupling at least a proportion of the third signal, which is determined by the error signal, to the first signal.

The method of the invention thus makes use of phase-/amplitude control feedback to provide variable capacitive coupling to the inductive loop thereby to hold the loop frequency substantially equal to the frequency of the reference source.

The fifth signal may be derived from the second signal and preferably is at the frequency of the second signal.

The error signal which is produced in the method of the invention is dependent on the change in inductance of the inductive loop, which causes any change in loop frequency, and thus can be processed in any suitable way to indicate the presence of an object in the active zone of the inductive loop.

The invention also provides apparatus for controlling the frequency of oscillation of an inductive loop which is excited by a first signal which includes means for generating a second signal at the frequency of the loop and at an amplitude which is dependent on the difference between the loop frequency and a predetermined frequency, and means for combining the second signal with a third signal which is dependent on the loop frequency to produce a fourth signal, the fourth signal being coupled to the first signal.

The fourth signal is preferably capacitively coupled to the first signal.

The means for generating the second signal may include means for comparing the loop frequency to a reference frequency, means for generating an error signal, and means responsive to the error signal for varying the amplitude of a fifth signal, at the loop frequency, thereby to produce the fourth signal.

The means for generating the second signal may include means for producing a selected one of a plurality of signals of different amplitudes at the loop frequency, the selected signal constituting the second signal.

The means for producing the selected signal may include a plurality of switching means, each of which has an input terminal and voltage dividing means connected thereto, a signal derived from the first signal being connected to each of the respective voltage dividing means, the switching means having a common output terminal to which the third signal is connected.

Means may be provided for varying the switching rate of the switching means. Preferably the switching rate is dependent on the difference in frequency between the loop frequency and the reference frequency.

BRIEF DESCRIPTION OF THE DRAWINGS

The invention is further described by way of example with reference to the accompanying drawings FIGS. 1 and 2 which illustrate a circuit used to control the frequency of operation of an inductive loop detector.

DESCRIPTION OF PREFERRED EMBODIMENTS

The circuit includes a sinusoidal oscillator 10 of any suitable type, a transformer 12 with a centre tapped primary winding 14, the ends of which are designated 14a and 14b respectively, and a secondary winding 16, a binary counter 18, an amplifier buffer stage 20, an electronic attenuator and signal inverter 22, a peak voltage detector 24, a comparator 26, a crystal controlled oscillator 28, a programmable frequency divider 30 and a combined phase comparator and voltage controlled oscillator 32. A loop 33 is connected across the winding 16.

In FIG. 1 the binary counter 18 is shown in simplified schematic form. FIG. 2 shows portion of the counter 18 with clock and reset terminals 34 and 36 respectively. Other components in FIG. 2 include a unity gain inverter 38 and a comparator 45. The voltage controlled oscillator of the device 32 is used to generate pulses which are applied to the binary counter 18.

The transformer 12 is a coupling transformer which matches the impedance of the oscillator 10 to the inductive loop 33. The transformer is a step down transformer and thus a relatively smaller tuning capacitor is required for the loop; this being provided by a capacitor 40.

The binary counter 18 is shown as a four stage device. The number of stages used in practice will normally be greater than this to achieve greater efficiency and accuracy in frequency control as emerges from the subsequent description. The binary counter 18 is represented as including a series of single pole double throw switches 18a to 18d, each of which has a traveller connected to respective outputs a to d. The normally closed terminal in each case is coupled to the VSS (negative) terminal of the device and the normally open terminal to the VDD (positive) terminal. The switches 18a to 18d are selectively enabled as the device is clocked by means of pulses applied to the terminal 34, see FIG. 2, to provide 16 different combinations in binary format.

The switches are connected to the end tap 14b of the primary winding 14 via a resistor 44, and resistors 42a to 42d respectively. The resistors 42a to 42d have different values chosen to ensure that different proportions of the signal existing in the lower half of the primary winding are tapped off to the switches.

The VDD terminal is connected to a voltage source by means of a resistor 46.

The upper end terminal 14a of the primary winding is connected to the input of the buffer stage 20 by means of a resistor 48.

The circuit 22 (part number MC3340) is an electronic attenuator and signal inverter and hence a signal applied to pin 1 appears inverted at the output, pin 7, at a level determined by a voltage input at a control pin 2.

The oscillator 28 is crystal controlled, and of conventional construction. It provides a reference frequency at 4992 kHz. This frequency is divided into one of eight frequencies by means of the programmable frequency divider 30. The eight frequencies lie within the range previously specified i.e. from 64 to 78 kHz.

In operation of the circuit the inductive detecting loop is excited by means of the oscillator 10. As stated the oscillator produces a sinusoidal oscillating signal with symmetrical half cycles and with controlled amplitude. Since the primary winding 14 is centre tapped the upper and lower terminals 14a and 14b of the primary winding have signals X and Y respectively which are 180° out of phase with each other relatively to the centre tap. Referring initially to the components 18 and 20 only it is apparent that as the switches 18a and 18d are selectively closed a proportion of the Y signal is output by the binary counter 18 and applied via the buffer stage 20 to the capacitor 40. This feedback signal is thereby capacitively coupled to the upper terminal 14a of the primary winding. In similar fashion a proportion of the X signal which is determined by the ratio of the resistors 46 and 48, is fed back via the buffer stage 20 and is capacitively coupled to the active side of the oscillator.

It follows that, depending upon which of the switches 18a to 18d are closed, the X and Y signals are combined in different proportions and a progressively greater or smaller in-phase or out-of-phase signal is applied back to the oscillator 10 via the capacitor 40. The lower half of the circuit of FIG. 1 thus functions as an electronic potentiometer.

If the signal fed back is in phase with, and equal in amplitude to, the signal on the oscillator side of the capacitor 40 then the capacitor is effectively transparent and the capacitor has no effect on the free running frequency of the loop oscillator. If the signal fed back is in phase but of greater amplitude on the buffer stage side then the frequency of oscillation is increased for the effect of the capacitor is reduced. Conversely if the voltages are out of phase i.e. in anti-phase then the frequency of oscillation is reduced for the effect on the capacitor is increased as the amplitude of the voltage fed back increases.

Thus the effect of the capacitor 40 can be adjusted from zero to its full capacitance effect and, in addition, a negative capacitance effect can be achieved. This feature enables the frequency of an inductive loop detector which resonates at a frequency below the stipulated frequency to be pulled higher, and vice versa. This provides an extremely versatile control.

In operation of the circuit, when all four switches 18a to 18d are in the mode illustrated, the signals applied to the inputs a to d are simply routed to negative. The signal input to the buffer stage 20 is therefore determined only by the ratio of the resistors 48 and 46 and the X signal. The resultant signal is amplified and inverted by the stage 20 and consequently applied to the capacitor 40 out of phase with the oscillator signal. This provides a maximum capacitance effect and pulls the oscillator circuit to a low frequency.

If the switch 18a is closed, by means of a clock pulse applied to the counter, then a portion of the Y signal is routed via the resistors 44 and 42a to the VDD terminal. This voltage is out of phase, and is combined with, the contribution from the X signal and consequently reduces the voltage input to the stage 20. The capacitance effect of the feedback signal is therefore reduced slightly and the oscillator frequency increases.

As the binary counter is progressively clocked the switches are activated and increasing proportions of the Y signal are applied to the VDD terminal. These steps take the voltage input to the stage 20 through zero to negative. With each combination of switches a different loop frequency is achieved and as there are 16 combinations it follows that 16 loop frequencies can be selected.

As previously pointed the accuracy of the tuning effect is dependent on the number of stages in the counter. For example if a 10 stage counter is used 1024 loop frequencies are selectable.

The lower half of the circuit shown in FIG. 1 is thus capable of adjusting the loop oscillating frequency to within a small percentage of the desired frequency. However as the frequency changes are brought about in step form a frequency between adjacent steps cannot be achieved. The capability of linearly fine tuning the oscillator frequency is achieved by means of the upper half of the circuit.

The phase comparator 32 (type 4046) is used to compare the frequency of the X signal i.e. the loop oscillator frequency to the frequency of a reference source derived from the oscillator 28 and the frequency divider 30. The frequency divider 30 is programmed to produce an authorized frequency in the frequency range from 64 to 78 kHz which will be normally be specified by a Government or similar authority. The phase comparator portion of the circuit 32 compares the loop oscillator's frequency and phase to the crystal reference signal output by the divider 30. The comparator is configured in such a way that if the loop frequency is higher than the reference frequency its output is high and vice versa. Similarly if the loop signal is leading in phase to the reference signal then the comparator output voltage is proportionally more positive, and vice versa. Consequently the phase comparator produces an error signal at its output which is proportional to the loop oscillator/reference source frequency or phase difference.

The error signal is applied to the control pin 2 of the attenuator and signal inverter 22. The Y signal is applied to the pin 1 of the attenuator and consequently appears inverted at the output pin 7 at a level which is determined by the voltage of the error signal.

A capacitor 50 removes the DC component of the attenuator output signal and a biasing offset is provided by resistors 52 and 54. Thus the peak positive swing of the resultant AC signal is represented as a DC voltage, output by the detector 24, across a capacitor 56.

The error signal is also used to trim the bias on the comparator 26. This comparator compares the peak voltage across the capacitor 56 to the input voltage derived from the error signal and if the two are not equal outputs a proportional signal which causes the attenuator 22 to adjust the amplitude of its output. This in turn alters the loop oscillator frequency until a point of balance is achieved where the reference signal from the divider 30 and the loop oscillator signal are perfectly in frequency and phase.

It should be added that the signal output by the attenuator at the pin 7 is also applied to the resistors 42a to 42d. Thus a proportion of this signal, determined by the arrangement of the switches 18a to 18d, is fed back to the buffer stage 20 to achieve a linear variation in the degree of capacitive coupling to the X signal and thereby to achieve a continuous frequency variation of the loop oscillator frequency.

The binary counter 18 thus provides a "digital variation" of the loop oscillator frequency whereas the upper half of the circuit of FIG. 1 enables the loop oscillator frequency to be linearly varied.

The error voltage produced by the phase comparator 32 is dependent on any variations in inductance of the loop detector. Such variations are caused for example by a vehicle traversing the loop. When the loop inductance is interfered with the circuits operate to maintain the frequency constant and the amplitude of the error signal necessary to achieve this is a measure of the inductance change.

Referring to FIG. 2 the error voltage output by the phase comparator 32 is smoothed by a capacitor 58, inverted by the inverter 38 which is of unity gain and high frequency components are filtered off via an RC network. The analogue voltage output by the inverter is a measure of the inductance change in the loop and the sensor 45 is configured to provide a high output should the analogue voltage drop below or rise above predetermined limits.

The circuitry shown in FIG. 2 is principally provided to tune the oscillator rapidly when it is switched on.

At switch on the analogue voltage output by the inverter 38 is out of the limits determined by the sensor 45. The sensor's output therefore goes high and the binary counter 18 is reset via a capacitor 60.

The voltage controlled oscillator section of the device 32 is configured to run as a variable clock pulse generator. The frequency of this oscillator is determined by the ratio of a capacitor 62 to resistors 64 and 66. When the analogue voltage is lower the oscillator runs at a rapid frequency for the resistor 66 is dominant. As a state of tune is approached the analogue voltage rises and the effect of the resistor 66 reduces. Eventually its effect is cancelled as a diode 68 becomes reverse biased. The resistor 64 then determines the frequency of operation of the oscillator.

It follows therefore that when the circuit is out of tune the oscillator runs at a high rate and the binary counter 18 is clocked accordingly. As a stage of tuning is approached the frequency of the oscillator 32 drops and the clock rate drops accordingly. Thus the rate of change of the frequency of the inductive loop detector is substantial when its frequency differs substantially from that of the reference source but the final tuning steps are slow so as to prevent over tuning occuring due to circuit response times.

The sensor 40, apart from sensing upper and lower analogue voltage trip points, is configured as a Schmitt trigger with a resistor 70 providing the necessary backlash. This ensures that the output of the sensor 40 remains high until the rising analogue voltage reaches a predetermined level. When this level is reached the sensor 45 switches low and the tuning oscillator 32 is disabled by dropping the voltage at its control pin to zero. This is a characteristic of the particular oscillator.

The circuit is now tuned and is able to respond to small inductance changes in the loop detector. Inductance changes, even of a minor nature, produce a substantial dc voltage shift in the analogue signal. This voltage shift is directly proportional to the degree of loop inductance change.

Various changes and modifications may be made to the cicuit thus far described without departing from the spirit of the invention. For example the loop 33 may be one of a plurality of similar loops which are selectively, or cyclically, coupled to the circuit by means of a switching means, or multiplexer, 35. The programmable frequency divider 30 may be switched simultaneously to provide different, corresponding frequencies to each loop. As each loop frequency is tightly controlled, with minimum deviation, by the self-tuning circuit, cross-talk is kept at a negligible level. Conversely, the loop signal may be modulated to turn on selectively, responders carried on detected vehicles. This is done as a prelude to the two way exchange of information between the vehicle and the detector. The oscillator 10 may therefore be modulated by means of an information-carrying signal derived from a source 37.

I claim:

1. A method of controlling the frequency of oscillation of an inductive loop which is excited in response to at least a first signal which includes the steps of deriving a second signal with an amplitude which is dependent on the amplitude of the first signal, deriving an intermediate signal which is in antiphase to the first signal, deriving a third signal with an amplitude which is dependent at least on the amplitude of the intermediate signal, combining the third signal with the second signal to produce a fourth signal, and further exciting the loop in response to the fourth signal thereby to vary the frequency of oscillation of the loop.

2. A method according to claim 1 wherein the fourth signal is capacitively coupled to the first signal.

3. A method according to claim 1 wherein the amplitude of the third signal is a variable proportion of the amplitude of the intermediate signal.

4. A method according to claim 3 in which the variable proportion is selected from one of a plurality of fixed proportions.

5. A method according to claim 3 in which at least a portion of the variable proportion is a continuously variable proportion.

6. A method according to claim 3 which includes the steps of reducing the rate of change of said proportion of the amplitude of the intermediate signal as the frequency of the loop approaches a desired frequency.

7. A method according to claim 1 which includes the steps of deriving a fifth signal which is at a frequency substantially equal to the frequency of oscillation of the loop, deriving a sixth signal which is at a frequency which is dependent on the frequency of a reference source, comparing the fifth and sixth signals, generating an error signal which is dependent on the frequency difference between the frequencies of the fifth and sixth signals, and using the error signal to vary the amplitude of the third signal.

8. A method according to claim 1 which includes the step of modulating the first signal by means of an information-carrying signal.

9. A method according to claim 1 which includes the step of selecting the loop from a plurality of inductive loops each of which has associated with it a distinct frequency of oscillation.

10. Apparatus for controlling the frequency of oscillation of an inductive loop which is excited in response to at least a first signal, said apparatus including means for producing a second signal at the frequency of the loop and with an amplitude which is dependent on the amplitude of the first signal, means for producing a third signal at the frequency of the loop and with an amplitude which is dependent on the frequency difference between the frequency of oscillation of the loop and a predetermined frequency, and means for combining the second signal with the third signal to produce a fourth signal, and means for further exciting the loop with the fourth signal thereby to vary the frequency of oscillation of the loop.

11. Apparatus according to claim 10 in which the fourth signal is capacitively coupled to the first signal.

12. Apparatus according to claim 10 wherein the means for producing the third signal includes means for comparing the frequency of oscillation of the loop to a reference frequency, means for generating an error signal which is dependent on the frequency difference between the frequency of oscillation of the loop and the reference frequency, and means responsive to the error signal for varying the amplitude of the third signal.

13. Apparatus according to claim 10 wherein the means for producing a third signal includes a plurality of switching means, each of which has an input terminal and voltage dividing means connected thereto, an intermediate signal with an amplitude which is dependent on the amplitude of the first signal being connected to each of the respective voltage dividing means, the switching means having a common output terminal at which the third signal is produced.

14. Apparatus according to claim 13 which includes means for varying the switching rate of the switching means.

15. Apparatus according to claim 14 in which the switching rate is dependent on the difference in frequency between the frequency of oscillation of the loop and a reference frequency.

16. Apparatus according to claim 10 which includes means for modulating the first signal.

* * * * *